United States Patent [19]

Yamaguchi et al.

[11] Patent Number: 4,503,329
[45] Date of Patent: Mar. 5, 1985

[54] ION BEAM PROCESSING APPARATUS AND METHOD OF CORRECTING MASK DEFECTS

[75] Inventors: Hiroshi Yamaguchi, Fujisawa; Tateoki Miyauchi, Yokohama; Akira Shimase, Yokohama; Mikio Hongo, Yokohama, all of Japan

[73] Assignee: Hitachi, Ltd., Tokyo, Japan

[21] Appl. No.: 427,584

[22] Filed: Sep. 29, 1982

[30] Foreign Application Priority Data

Sep. 30, 1981 [JP] Japan .................................. 56-153806

[51] Int. Cl.$^3$ .............................................. G01N 23/00
[52] U.S. Cl. .................................... 250/309; 250/492.2
[58] Field of Search ...................... 250/309, 492.2, 398

[56] References Cited

U.S. PATENT DOCUMENTS 3,889,115  6/1975  Tamura et al. ...................... 250/309
4,063,091 12/1977  Gee ..................................... 250/309
4,085,330  4/1978  Wolfe .................................. 250/398
4,361,762 11/1982  Douglas ............................. 250/251

OTHER PUBLICATIONS

"A High-Intensity Scanning Ion Probe with Submicrometer Spot Size", Seliger et al., *Appl. Phy. Lett.*, 34 (5), Mar. 1979, pp. 310-312.

*Primary Examiner*—Bruce C. Anderson
*Attorney, Agent, or Firm*—Antonelli, Terry & Wands

[57] ABSTRACT

Disclosed is an ion beam processing apparatus comprising within a vacuum container a specimen chamber with a table for mounting a specimen provided therein, a high intensity ion source, such as a liquid metal ion source or an electric field ionizing ion source which operates in ultra-low temperature, confronting the specimen chamber, an extraction electrode for extracting an ion beam out of the ion source, a charged-particle optical system for focusing the ion beam to a spot, and an aperture for adjusting the spot diameter.

12 Claims, 32 Drawing Figures

ION BEAM PROCESSING APPARATUS AND METHOD OF CORRECTING MASK DEFECTS

The present invention relates to an ion beam processing apparatus which performs superfine machining on the mask of a semiconductor integrated circuit.

It has conventionally been difficult to perform micromachining for a work piece by projecting a high energy ion beam to a small area of the work piece. Recently, semiconductor integrated circuits (ICs) have advanced significantly in miniaturization and packing. The dimension of wiring patterns is changing from 3 $\mu$m to 2 $\mu$m, and it is expected that wiring patterns having a width of 1–1.5 $\mu$m will come out few years later. This will requires advanced technology for correcting defects created on the mask.

However, reduction in the spot diameter of the laser beam is limited to above 0.5 $\mu$m due to the diffraction limit. This is the limit of focusing by the laser, and it means that more fine patterns cannot be handled by mask correcting technology by the laser. Therefore, for integrated circuits having wiring patterns 1–1.5 $\mu$m or less, mask defects of 0.3–0.5 $\mu$m or more are determined as being defective, and the minimum unit of correction smaller than that value is required. However, due to the focusing limit as mentioned above, the conventional laser processing technologies cannot meet the requirement.

The above explanation is for the correction of a photomask used for the exposure to visible rays and ultraviolet rays. As the miniaturization of wiring patterns further advances, satisfactory micromachining cannot be achieved by photoetching technology using a light beam having problems of diffraction and scattering, and exposure by use of X-rays with less diffraction and scattering or parallel ion beam is considered.

FIGS. 1A through 1E show an example of fabricating a mask for the X-rays exposure. First, as shown in FIG. 1A, a parylene film 24 with a thickness of a few $\mu$m is formed on a silicon substrate 23 having a thickness of about 100 $\mu$m, and a thin film of chrome 25 having a thickness of 100 Å is formed on the parylene film 24. Then a thin film of gold 26 having a thickness of 1000 Å is formed as an X-rays absorber on the chrome film 25, and further a PMMA resist 27 having a thickness of about 1000 Å is coated on the gold film 26. An electron beam exposing apparatus is used to project circuit patterns on the PMMA resist 27. After the substrate has been treated under the development process, grooves 28 and 29 as shown in FIG. 1B are formed in the PMMA resist 27. Using the grooves 28 and 29 in the PMMA resist 27, patterns of chrome 30 having a thickness of about 1000 Å are formed as shown in FIG. 1C. In more detail, in the state shown in FIG. 1B, chrome is deposited from the top surface for a thickness of about 1000 Å, and the PMMA resist 27 is removed by an etchant. Then chrome coated on the PMMA resist 27 is removed together with the PMMA resist 27, and the chrome resist patterns 30 are produced. Thereafter, ion beam etching is performed so as to remove the thin gold film 26 in portions where the thin chrome resist 30 is absent, and the structure shown in FIG. 1D is formed. Finally, the silicon substrate 23 is etched deeply from the bottom, leaving only portions necessary for the support. Then, as shown in FIG. 1E, an X-rays resist made up of the thin gold film 26 of about 1000 Å for absorbing X-rays only in the necessary portions and the thin chrome resist film 30 of about 1000 Å which does not absorb X-rays, and parylene film 24 in the remaining portions are produced on supporting sections 23'.

Next, an example of the mask for collimated ion beam exposure will be described with reference to FIG. 2. This mask is made up of a supporting film 31, an ion absorber 32 and a spacer 33. The supporting film is formed of a material which makes the scattering of the transmitted ion beam as small as possible. For example, this is a monocrystalline silicon film having a vertical crystal axis, utilizing the fact that if the incident direction of the ion beam coincides with the crystal axis of the silicon supporting film, most of the incident ion beam is transmitted by channeling, resulting in less scattering of ions. In another example, a supporting film of a very thin and hard material is used. For example, an ion beam is transmitted by the thin film of $Al_2O_3$ having a thickness of several hundreds to several thousands Å extended in a mold of pyrex. Under the supporting film 31, a thin film of gold, for example, is formed as an ion absorber 32, and patterns are formed on it. The method of formation is similar to that of the X-rays mask, including electron beam exposure to the resist such as PMMA and etching following the exposure.

In the foregoing, the X-rays exposure mask and the collimated ion beam exposure mask have been described. In fabricating these masks, the processes of exposure and development for the resist such as PMMA are required, and the occurrence of defects caused by foreign matters during the processes cannot be avoided.

X-rays exposure and ion beam exposure are expected to be applied to the fabrication of patterns of 1 $\mu$m or less, however, defects still exist in the mask used in these exposures, and a correction accuracy of 0.2 $\mu$m or less is required. It is obvious from the foregoing that correction by the laser machining method cannot be applied to these processes. As an example of the prior art, see R. L. Seliger et al "A high-intensity scanning ion probe with submicrometer spot size" Appl. Phys. Lett. 34 (5); Mar. 1, 1979, pp. 310–312.

It is an object of the present invention to overcome the foregoing prior art drawbacks and provide an ion beam processing apparatus which is capable of correcting superfine defects occurring in the photomask, X-rays exposure mask and ion beam exposure mask used in fabricating integrated circuits with wiring patterns of 1–1.5 $\mu$m or smaller than 1 $\mu$m, with a sufficient accuracy and practical productivity.

The ion beam processing apparatus according to the present invention has the following features. There is formed a specimen chamber within a vacuum container, with a tray for mounting a mask provided within the specimen chamber, and a high-intensity ion source such as a liquid metal ion source or an electric field-ionizing ion source which operates in ultra-low temperature is provided within the vacuum container so that it confronts the specimen chamber. The arrangement includes an electrode for extracting an ion beam out of the ion source, electrostatic lenses for focusing the ion beam into a spot, an aperture for the ion beam, a blanking electrode for deflecting the ion beam out of the aperture, deflection electrodes for making the ion beam spot to scan the work piece in a specified pattern, power supplies for the above-mentioned electrodes and electrostatic lenses, a secondary charged-particle detector which detects secondary charged-particles emitted on the work piece as it is exposed to the ion beam and provides a signal representing the amount of secondary charged-particles, and a monitor display for displaying a luminance signal from the secondary charged-particle detector. The machining position on the work piece displayed on the monitor is set by electronic lines or the like, and the blanking electrode is operated or a rectangular opening of the aperture is adjusted so as to project and sputter the ion beam to the machining position.

The ion beam processing apparatus according to the present invention has also such a feature that the ion beam projecting over the work piece is neutralized electrically to prevent the position, size and shape of the ion beam spot from being disturbed by electric charge of the correcting specimens.

The present invention also relates to a method of correcting defects on the mask, wherein an ion beam is extracted out of a high-intensity ion source such as a liquid metal ion source or an electric field ionizing ion source which operates in the ultra-low temperature, the ion beam is focused into a fine spot by the optical system for charged-particles, and the ion beam spot is projected and sputtered to a black spot defect on the mask so that it is removed.

Figure 1A:
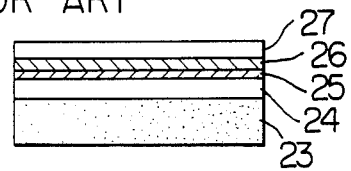
FIGS. 1A through 1E are illustrations showing, as an example, the fabricating process of an X-rays mask.
Figure 1B:
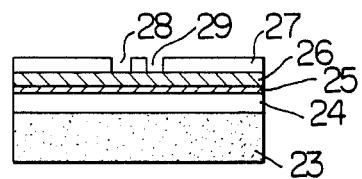
Figure 1C:
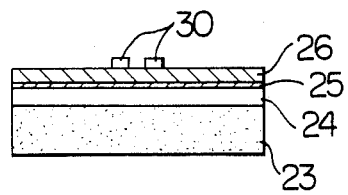
Figure 1D:
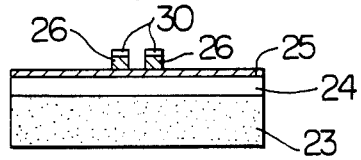
Figure 1E:
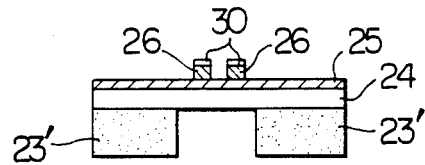
Figure 2:
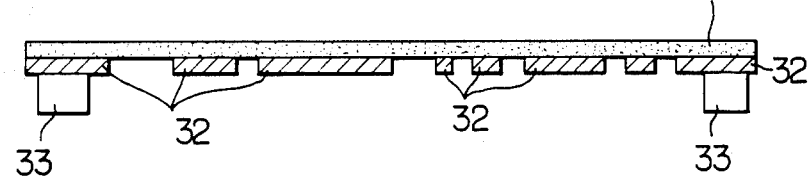
FIG. 2 is a longitudinal cross-sectional view showing an example of the ion beam exposure mask.
Figure 3:
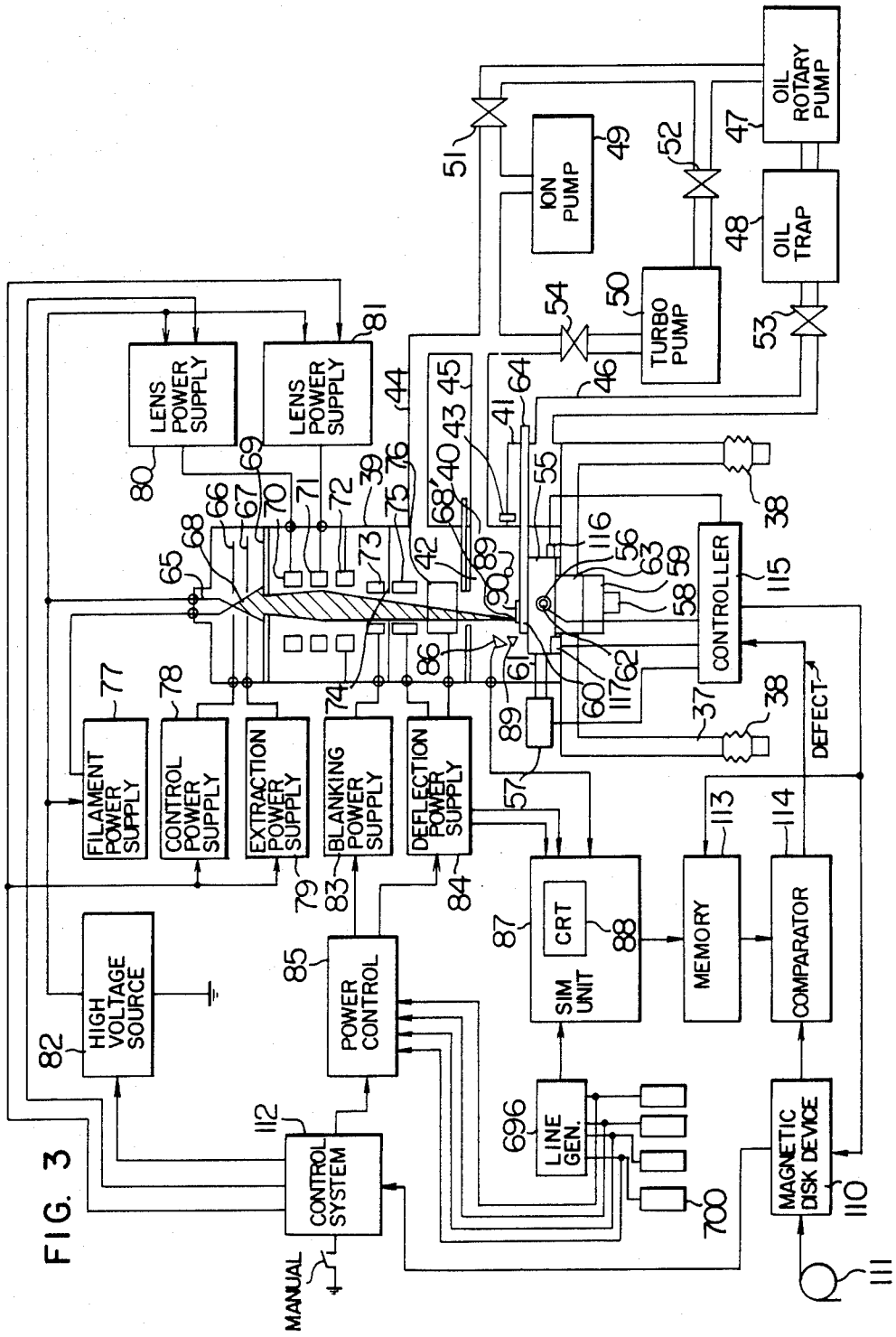
FIG. 3 is a block diagram showing an embodiment of the apparatus for carrying out the method of correcting a mask defect according to the present invention.

FIG. 3 shows an embodiment of the mask defect modification apparatus according to the present invention. The arrangement of FIG. 3 includes a bed 37, a column 39 and a specimen chamber 40, both constituting a vacuum container, a specimen exchanging chamber 41 provided adjacent to the specimen chamber 40, a pumping system, a mask table 55 for mounting a specimen, a liquid-metal ion source 65, a control (bias) generating electrode 66, an ion beam extracting electrode 67, an aperture (circular opening) 69, electrostatic lenses 70, 71 and 72, a blanking electrode 73, an aperture (rectangular opening) with micrometer 74, a pair of deflection electrodes 75 and 76, a filament power supply 77, a control electrode power supply 78, an extracting electrode power supply 79, electrostatic lens power supplies 80 and 81, a high voltage power supply 82, a blanking electrode power supply 83, a deflection electrode power supply 84, a power supply controller 85, a secondary charged-particle detector 86 inserted in the specimen chamber 40, a scanning ion microscope (SIM) observation unit 87, and a means 89 for preventing the spot disturbance caused by charges of the ion beam.

The bed 37 is proof against dusts by provision of air support 38. The specimen chamber 40 and specimen exchange chamber 41 are located over the bed 37, and the mirror tube 39 is located over the specimen chamber 40. The specimen chamber 40 is separated from the column 39 and the specimen exchange chamber 41 by gate valves 42 and 43, respectively.

The pumping system is arranged including an oil rotary pump 47, an oil trap 48, an ion pump 49, a turbo molecular pump 50, and valves 51, 52, 53 and 54. The pumping system is connected to the column 39, the specimen chamber 40 and the specimen exchange chamber 41 through pipes 44, 45 and 46, respectively, so that the mirror tube 39, specimen chamber 40 and specimen exchange chamber 41 are evacuated to the extent of $10^{-5}$ torr or less.

The table 55 is provided with feed micrometers 56, 57 and 58 for the X, Y and Z directions through rotary feedthroughs 61, 62 and 63, respectively, and further provided with a travelling ring 59 for the $\theta$ direction, so that the table 55 can be moved finely in the X, Y and Z directions and around the vertical axis.

On the table 55, there is disposed a specimen tray 60 on which a specimen mask is placed. The specimen tray 60 can be moved between the specimen chamber 40 and the specimen exchange chamber 41 by a specimen drawing (taking) bar 64. When the specimen is replaced, the gate valve 43 is opened, the specimen tray 60 is taken out into the specimen chamber 40, the gate valve 43 is closed, the door of the specimen exchange chamber 41 is opened, the specimens are changed, the door is closed, the specimen exchange chamber 41 is evacuated preliminarily, the gate valve 43 is opened, and then the specimen tray 60 is placed within the specimen chamber 40. In FIG. 3, the specimen is shown by a reference numeral 90.

The liquid metal ion source 65 is located at the top of the column 39 so that it confronts the specimen chamber 40. The liquid metal ion source 65 shown in FIG. 4 includes an insulating base 650, filaments 651 and 652 assembled in V-shape on the base 650, an acute needle 653 made of tungsten or the like and spot-welded between the tips of the filaments 651 and 652, and a metal piece 654 attached on the needle 653 so as to serve as an ion source. For the ion source metal 654, Ga, In, Au, Bi, Sn, or Cu is used. The filaments 651 and 652 are connected through terminals 651' and 652' to the filament power supply 77 which is connected to the high voltage power supply 82.

The control electrode 66 is located below the liquid metal ion source 65 and connected electrically to the control electrode power supply 78 which is connected to the high voltage power supply 82. A low positive or negative voltage is applied to the control electrode 66 so as to control the ion beam current.

The ion beam extraction electrode 67 is located below the control electrode 66 and connected electrically to the extraction electrode power supply 79 which is connected to the high voltage power supply 82. With a current supplied to the filaments 651 and 652 of the liquid metal ion source 65 so as to melt the metal in the vacuum of $10^{-5}$ torr or less, and with a negative voltage of several kV to several deca-kV applied to the extraction electrode 67, an ion beam is drawn out of a very narrow area at the tip of the needle 653 in the liquid metal ion source 65. In FIG. 3, the ion beam is shown by a reference numeral 68 and its spot is shown by 68'.

The circular aperture 69 is located below the extraction electrode 67, and serves to pass only the central portion of the ion beam which has been extracted by the extraction electrode 67.

The electrostatic lenses 70, 71 and 72 are aligned below the aperture 69 and connected electrically to the lens power supplies 80 and 81 which are connected to the high voltage power supply 82. These lenses 70, 71 and 72 serve to focus the ion beam which is fed through the aperture 69.

The blanking electrode 73 is located below the electrostatic lens 72 and connected electrically to the blanking electrode power supply 83 which is connected to the controller 85. The blanking electrode 73 swings the ion beam very quickly so as to deflect the beam out of the rectangular aperture 74 located below the blanking electrode 73, so that projection of the ion beam to the specimen is interrupted quickly.

The pair of deflection electrodes 75 and 76 are located below the aperture 74 and connected electrically to the deflection electrode power supply 84 which is connected to the controller 85. The deflection electrodes 75 and 76 deflect the ion beam spot, which has been focused by the electrostatic lenses 70, 71 and 72, in the X and Y directions so that the beam spot is positioned to a black spot defect on the specimen.

The high voltage power supply 82 supplies a high voltage of several deca-kV to the filament power supply 77 for the liquid metal ion source 65, the control electrode power supply 78, the ion beam extraction electrode power supply 79, and the lens power supplies 80 and 81.

The controller 85 operates on the blanking electrode power supply 83 and the deflection electrode power supply 84 to operate the blanking electrode 73 and the deflection electrodes 75 and 76 in accordance with the specified scanning pattern.

The secondary charged-particle detector 86 is located within the specimen chamber 40 so that it confronts the specimen. The detector 86 catches secondary electrons or secondary ions emitted from the specimen as it is exposed to the ion beam, transduces the intensity of emission into a signal of electric current, and sends the signal to the SIM observation unit 87.

The SIM observation unit 87 receives from the deflection electrode power supply 84 signals representing the ion beam deflection in the X and Y directions and performs the scanning of its cathode ray tube (CRT) 88 in synchronization with the signals, and at the same time, varies the intensity of the CRT spot in accordance with the secondary emission signal provided by the secondary charged-particle detector 86, whereby the image of the specimen representing the amount of secondary electron emission at each point of the specimen is displayed. Owing to the function of the SIM (scanning ion microscope), the specimen surface can be observed on magnified scale.

The inspection system for the specimen 90 has a memory 113, a comparison circuit 114 and a magnetic disk 110. The memory 113 records a binary image signal produced by the SIM observation unit 87 based on signals detected from the secondary charged-particle detector 86. The magnetic disk 110 stores original pattern information supplied through a magnetic tape 111. The comparison circuit 114 retrieves in the memory 113 the image data of the specimen 90 at the position specified by the positional information of the image supplied from the controller 115 and compares it with the original pattern data retrieved on the magnetic disk 110, then determines to be defective when both patterns do not coincide with each other.

The inspection system for the specimen 90 is connected with control system 112, which in turn is connected to the high voltage power supply 82, the controller 84, and the lens power supplies 80 and 81. The control system 112 is arranged such that it switches the power supplies connected to the high voltage power supply 82 and the controller 85 to provide a small current and low acceleration voltage for producing an ion beam for a wide scanning area when the specimen 90 is observed or inspected for defects, and to provide a large current and high acceleration voltage for producing an ion beam for a narrow scanning area when the detected defect is removed or corrected.

Figure 5:
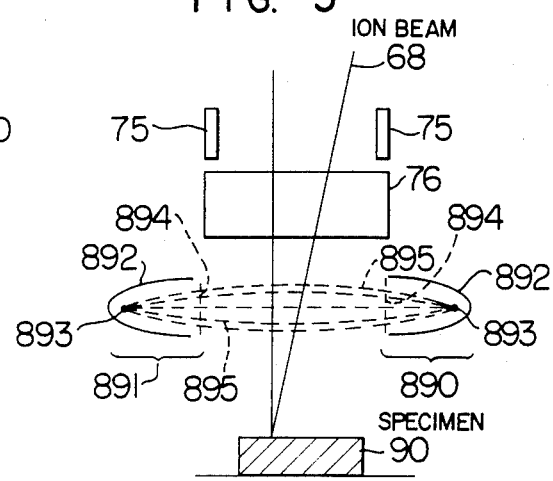
FIG. 5 is an enlarged cross-sectional view showing an embodiment of means for preventing the spot disturbance caused by charges of the ion beam.

In FIG. 3, reference numerals 116 and 117 denote linear encoders. There is disposed between the deflection electrode 76 and the specimen 90 a means 89 for preventing the spot disturbance caused by charges of the ion beam. The means 89 for preventing the spot disturbance as shown in FIG. 5 includes a pair of electron shower units 890 and 891 which confront with each other on the axis intersecting the ion beam path, and each of the electron shower units 890 and 891 is made up of a cup-shaped main body 892, a filament 893 provided within the body, and a grid-shaped extraction electrode 894 attached at the opening section of the body 892. The electron shower units 890 and 891 take out streams of electrons 895 from the filament 893 by an acceleration voltage of around 100 V applied to the extraction electrode 894, and release the electron streams 895 into the space where the ion beam goes through, thereby charging the ion beam negatively for neutralization. In FIG. 5, reference numeral 68 denotes the ion beam, 75 and 76 are deflection electrodes, and 90 is the specimen.

The following will describe in connection with FIG. 3 and FIGS. 6A–6D the performance of the foregoing embodiment of the defect correcting apparatus and one specific form of the defect correcting method according to the present invention. The foregoing apparatus is used for inspecting a defect on the mask and correcting the defect.

Before placing a specimen 90 in the specimen chamber 40, the entire vacuum container 39 is evacuated by a vacuum pump means. The specimen tray 90 is drawn out into the specimen exchange chamber 41 by means of the drawing bar 64 provided on the tray 60. The gate valve 43 is closed, the door of the specimen exchange chamber 41 is opened, and the specimen 90, i.e., a mask, is placed on the specimen tray 60. After preliminary evacuation for the specimen exchange chamber 41, the tray 60 is entered into the specimen chamber 40 and the tray 60 is placed at the specified position on the table 55. Subsequently, the pumping system is activated to evacuate the column 39 and the specimen chamber 40 to the extent of $10^{-6}$ torr. The X-axis and Y-axis drive motors 56 and 57 are operated through the controller 115 to move the table 55 so that the inspection start position on the specimen 90 is set. The Z-axis fine feeding micrometer 58 and the $\theta$-axis rotating ring 59 are operated so that the specimen position is finely adjusted in the Z-axis direction and on the horizontal plane.

Subsequently, the control system 112 is operated to switch the high voltage power supply 82, controller 85 and the lens power supplies 80 and 81 so that a small current and low acceleration voltage for producing an ion beam having a wide scanning range are supplied to the electrodes 77–81, 83 and 84. Then, observation and inspection for defects on the specimen 90 are started.

The filament in the liquid metal ion source 65 is heated by being supplied with a current from the power supply 77, and when a negative voltage of several kV to several deca-kV from the power supply 79 is applied to the extraction electrode 67, an ion beam 68 is extracted out of a very narrow area on the tip of the filament in the liquid metal ion source 65. At the same time, a low positive or negative voltage from the power supply 78 is applied through the control electrode 66 to the portion near the tip of the filament in the liquid metal ion source 65 to thereby control the ion beam current.

The ion beam 68 extracted from the liquid metal ion source 65 is passed through the circular aperture 69 so that only the central portion of the beam is extracted. Then the ion beam is focused to a spot 68' having a diameter of 0.5 $\mu$m or less by means of the electrostatic lenses 70 and 71 with voltages from the power supplies 80 and 81 applied thereto and another electrostatic lens 72. Then, the ion beam is deflected in the X and Y directions by the deflection electrodes 75 and 76 with a voltage from the power supply 84 applied thereto, and the ion beam spot 68' is focused on the surface of the specimen 90.

As mentioned previously, when the ion beam 68 is projected onto the surface of the specimen 90, secondary charged-particles are emitted from the specimen 90. The secondary charged-paticles, i.e., secondary electrons or secondary ions, are caught by the secondary charged-particle detector 86, which then transduces the intensity of emission into an electric current and supplies the current to the SIM observation unit 87. The SIM observation unit 87 receives from the deflection electrode power supply 84 the signals indicating the amount of ion beam deflections in the X and Y directions, and swings the spot of the CRT (TV monitor display) in synchronization with the signals. At the same time, the intensity of the CRT spot is varied in accordance with the current signal from the secondary charged-particle detector 86, and the image of the specimen 90 is displayed.

Subsequently, the image signal of the specimen 90 obtained by the SIM observation unit 87 is converted to a binary signal by the binary circuit (not shown), and the binary signal is stored by the memory 113 in the inspection system for the specimen 90. The binary signal represents whether or not a Cr pattern exists on a mask as a specimen.

The comparison circuit 114 in the specimen inspection system takes out the binary image signal of the specimen 90 from the memory 113 and takes out the pattern information corresponding to the binary image signal from the original pattern information stored in memory means comprising the magnetic disk 110 in accordance with the image positional information given by the controller 115 for driving the table 55, then compares the specimen image with the original pattern information and determines to be defective if both data do not coincide with each other.

In this way, by use of the secondary electron image or secondary ion image produced by the scanning of the ion beam 68 having a diameter of 0.5 $\mu$m or less, pattern defects of smaller than 0.5 $\mu$m can be inspected.

Figure 10A:
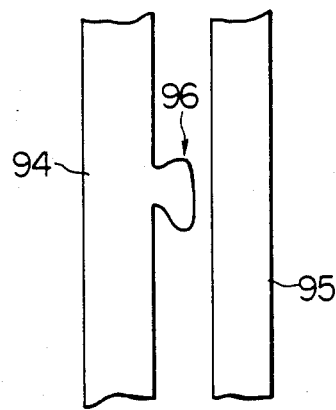
FIGS. 10A through 10C and FIGS. 11A through 11C are illustrations showing the defect correcting processes performed by use of the aperture having variable opening dimensions.

When a defect is detected on the specimen 90, the table 55 is positioned by turning manually the feed micrometers 56 and 57 and the $\theta$-direction feed cylinder 59 which are provided outside of the specimen chamber 40 through the rotary feedthroughs 61, 62 and 63, such that the defect 96 is positioned to substantially the center of the CRT (TV monitor display) 88, i.e., in the middle of the deflection electrodes 75 and 76, as shown in FIG. 10A. In FIG. 10A reference numerals 94 and 95 denote wiring patterns on the mask, and 96 shows the defective portion.

In order to remove the defect, first, the control electrode 66 and extraction electrode 67 are operated to take out an ion beam 68 with a low acceleration voltage of several kV or less from the ion source metal 654 through the needle 653 of the liquid metal ion source 65. The spot 68' of the ion beam is manipulated to scan the surface of the specimen 90, and the surface of the specimen is displayed on a magnified scale on the CRT (TV monitor display) 88 of the SIM observation unit 87 in accordance with the deflection signal (saw tooth wave) from the deflection electrode power supply 84 and the signal from the secondary charged-particle detector 86.

Figure 12:
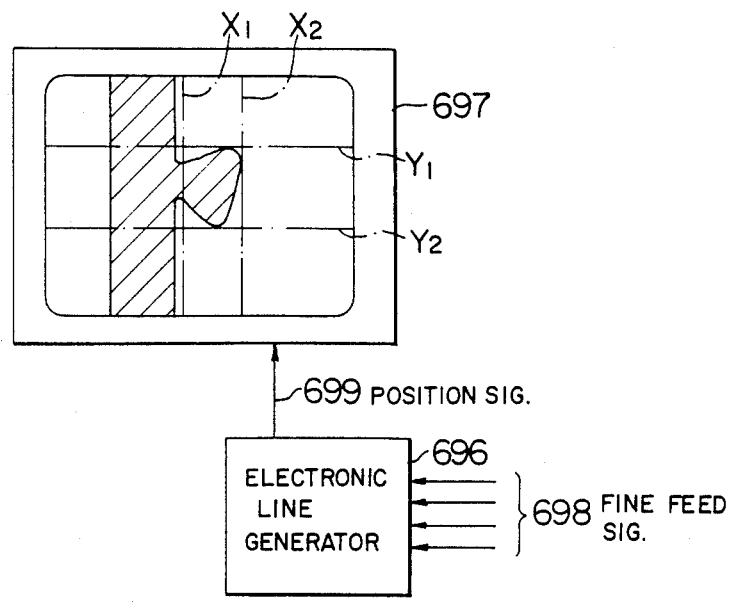
FIG. 12 is a block diagram of the device for displaying the positional and dimensional adjustments between the black spot defect and the opening of the aperture having the variable opening dimensions.

As shown in FIG. 12, four electronic lines $X_1$, $X_2$, $Y_1$ and $Y_2$ are displayed on the screen of the TV monitor display 697 (88). The operator moves the displayed electronic lines by operating an electronic line generator 696 by application of signals 698 from potentiometers or the like, so that the defect 694 (shown in FIG. 10B) is enclosed within a rectangle formed by the four electronic lines $X_1$, $X_2$, $Y_1$ and $Y_2$.

After the observation and inspection for the specimen 90, the blanking electrode 83 is operated so as to swing the ion beam 68 quickly out of the aperture 74, thereby halting the exposure of the specimen 90 to the ion beam 68 quickly.

Figure 6A:
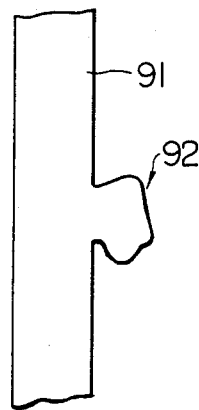
FIGS. 6A through 6D are illustrations showing the specific forms of the present invention performed by use of the apparatus shown in FIG. 3.
Figure 6B:
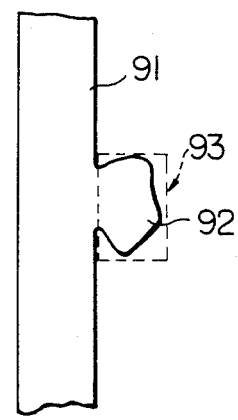
Figure 6D:
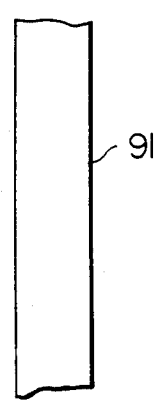
Figure 6C:
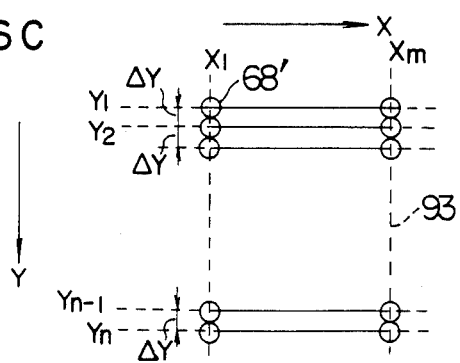

Subsequently, a negative voltage of several deca-kV is applied to the ion beam extraction electrode 67 so as to extract an ion beam 68 out of a very narrow area of the tip of the needle 653 in the liquid metal ion source 65, and the ion beam current is controlled by application of a much lower positive or negative voltage to the control electrode 66. The ion beam 68 is entered through the aperture 69 to allow only the central portion of the beam to pass through, then the ion beam is focused by the electrostatic lenses 70, 71 and 72 and its spot 68' is projected to a black spot defect 92 on the specimen 90 while being deflected in the X and Y directions by the deflection electrodes 75 and 76, whereby the defective portion of the specimen can be processed by sputtering. In correcting the black spot defect 92, the ion beam spot 68' on row $Y_1$ is swung in the X-axis direction, as shown in FIG. 6C, and in this case when the beam spot has come to $X_1$ on the X coordinate, the blanking electrode 73 is operated so that the ion beam reaches the specimen, and when the beam spot has come to $X_m$, the blanking electrode is operated so that the ion beam is deflected from the specimen. Then, the beam spot is shifted in the Y-direction by $\Delta Y$, and on the row of $Y = Y_2$ the ion beam is swung in the X-direction in the same manner. This operation is repeated until the row of $Y - Y_n$ has been scanned. Thus the area of $X_1 \leq X \leq X_n$ and $Y_1 \leq Y \leq Y_n$ is exposed to the ion beam, and defects are removed by the sputtering process.

In this way, the area of $X_1 \leq X \leq X_m$ and $Y_1 \leq Y \leq Y_n$ enclosed by the electronic lines $X_1$, $X_2$, $Y_1$ and $Y_2$ is exposed to the ion beam, and the defect is removed by the sputtering process.

Figure 16:
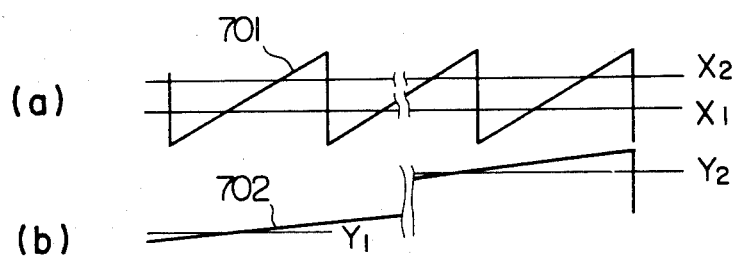
FIG. 16 is a diagram of saw tooth waves supplied to the deflection electrode power supply.

The controller 84 supplies the blanking signal to the power supply 82 before and after voltage levels 701 and 702 of the saw tooth waves supplied to the deflection electrode power supply 84 become equal to voltage signals $V_{X1}$, $V_{X2}$, $V_{Y1}$ and $V_{Y2}$ obtained from potentiometers 700, as shown in FIG. 16 (a) and (b), so as to operate on the blanking electrode 73 to deflect the ion beam out of the aperture 74. In consequence, only the area enclosed by the electronic lines is subjected to the sputtering process.

When a defect on the pattern of the specimen 90 has been detected by the comparison circuit 114 in the inspection system for the specimen 90 and when the defect is removed by the sputtering process, the control system 112 is switched to provide a large current and high acceleration voltage for producing an ion beam 68 having a narrow scanning range which is suitable for the correction process. A large current ion beam 68 is extracted out of the liquid metal ion source 65 and it is subjected to a high acceleration voltage by the control electrode 66, then it is concentrated to a spot of 0.5 $\mu$m or less in diameter by the electrostatic lenses 70, 71 and 72. The ion beam 68, with its scanning range limited by the deflection electrodes 75 and 76, is projected to the defective portion of the pattern, whereby the defect is removed by sputtering. The ion beam 68 may be focused on the defective portion so that the defect is removed by sputtering.

Thus, correction by use of the micro ion beam allows the removal and correction of a small defect of 0.5 $\mu$m or less.

After the defect on the pattern of the specimen 90 has been corrected, the control system is restored to the conditions suitable for observation and inspection, and the corrected pattern on the specimen 90 can be checked by taking the same operating procedures as described above.

After defects of the pattern on the specimen 90 have been corrected completely, all power supplies are turned off, the gate valve 42 to the upper half specimen chamber 40 in the vacuum container 39 is closed, and another gate valve 43 is opened. Then the specimen tray 60 is drawn out into the specimen exchange chamber 41 using the drawing bar 64, and the corrected mask is taken out.

In the arrangement of the present invention, voltage division resistors may be used in place of the high voltage power supply 82.

Arrangement may also be made such that a threshold circuit is connected to the secondary charged-particle detector 86, which then provides binary signal having a 0's level and a 1's level for the SIM observation unit depending on whether the secondary emission is higher than or lower than the reference level.

A black spot defect and a pattern connected to the black spot defect on the mask which the present invention concerns are made of metal or metal compound, and they exist separately and are not grounded. Therefore, when the charged ion beam is projected to the pattern, charges are accumulated on the pattern, that effects the path of the ion beam coming succeeding. This causes the ion beam 68 to make a larger spot 68' or deviate from the scanning locus, and causes the deformation at the edge of the focused image of the aperture 74, resulting in an unsatisfactory processing.

On this account, the means 89 for preventing the spot disturbance caused by charges of the ion beam has electron shower units 890 and 891, which release electrons streams 895 to the ion beam 68 so as to charge the ion beam negatively for neutralization. In consequence, spreading of the ion beam 68 by the space charge effect, deflection of the scanning locus of the beam spot 68' and deformation at the edge of the image of the aperture 74 can be prevented, whereby the accuracy of correcting black spot defects can further be improved.

For taking out the mask which has been corrected through the foregoing process, the gate valve 42 between the column 39 and the specimen chamber 40 is closed, the gate valve 43 between the specimen chamber 40 and the specimen exchange chamber 41 is opened, the specimen tray 60 is drawn out into the specimen exchange chamber 41 using the specimen drawing bar 64, the gate valve 43 is closed, the door of the specimen exchange chamber 41 is opened, and the corrected mask is taken out. The corrected mask is then transferred to the subsequent process.

A satisfactory processing result of the removal of a black spot defect was obtained under the processing conditions that, for a black spot defect on the chrome mask having a thickness of 600 Å, an ion beam is extracted out of the liquid metal ion source of gallium with an acceleration voltage of 45 kV, and the ion beam is focused to a spot of 0.2 $\mu$m in diameter by the electrostatic lenses, which scans the mask surface at a speed of 20 $\mu$m/sec by the operation of the deflection electrodes.

The following will describe other embodiments of the present invention.

First, the pumping system is not limited to that shown in FIG. 3, but instead the system may be arranged by combination of an oil rotary pump, a diffusion pump and an oil trap. Still another arrangement is the combination of an oil rotary pump, a cryo pump, an ion pump and a titanium pump.

Figure 4:
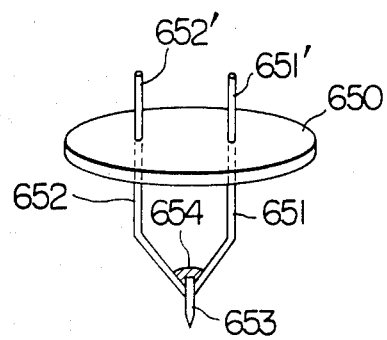
FIG. 4 is an enlarged perspective view showing an embodiment of the liquid metal ion source used in the apparatus shown in FIG. 3.
Figure 7:
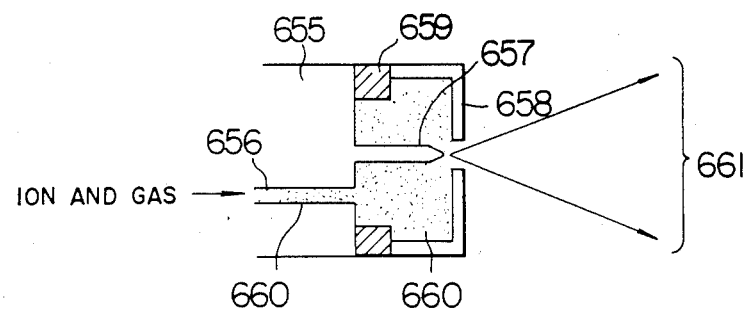
FIG. 7 is an enlarged cross-sectional view of another example of the ion source of the ultra-low temperature electric field ionization type.

The ion source is not limited to the liquid metal ion source 65 shown in FIGS. 3 and 4, but instead an ion source of the ultra-low temperature electric field ionization type operating in the vacuum of $10^{-9}$ torr or less can also be used. FIG. 7 shows such an ion source of the ultra-low temperature electric field ionization type. The arrangement shown in FIG. 7 includes a supporter 655 having a gas releasing hole 656, a metallic needle 657 attached on the supporter 655, and an extraction electrode 658 which is insulated electrically from the supporter 655 by means of an insulator 659 made of sapphire or the like. The supporter 655 is conducted to a liquid helium refrigerator so that the supporter 655 and the needle 657 are cooled to the liquid helium temperature. Ionizing gas 660 of a rare gas, e.g., helium, is introduced through the hole 656 formed in the supporter 655, and gas atoms are deposited densely on the surface of the needle 657. With a high voltage applied to the extraction electrode 658, the gas atoms are ionized in the very narrow area on the tip of the needle 657 and they are extracted out as an ion beam 661. The ion source of the ultra-low temperature electric field ionization type provides a very high deposition density of gas atoms at the tip of the needle as compared with the ion source of the normal temperature electric ionization type, thereby serving as a high intensity ion source.

The charged-particle optical system for focusing the ion beam is not limited to the set of three electrostatic lenses 70, 71 and 72 shown in FIG. 3, but Eintzeln lenses can also be used, and further the number of lenses is not limited to three.

The spatial relationship among the lenses of the charged-particle optical system, the blanking electrode, the aperture, and the deflection electrodes is not limited to that shown in FIG. 3, but many variations are possible.

FIGS. 8A through 8D show various embodiments for the lenses of the charged-particle optical system and the aperture. The arrangement of FIG. 8A has an aperture 681 located below ion source 680, and a set of lenses 700, 701 and 702 is disposed below the aperture 681, so that the image of the aperture 681 is focused by the lenses 700, 701 and 702 on the specimen 90.

Figure 8A:
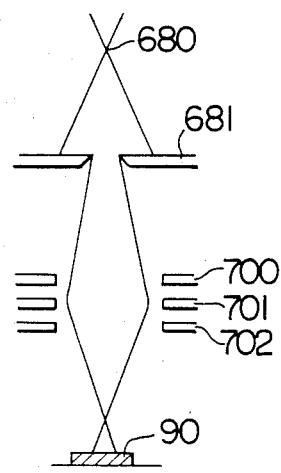
FIGS. 8A through 8D are illustrations of various embodiments where the lens of the charged-particle optical system and the aperture for focusing the ion beam on the work piece are combined in various ways.
Figure 8B:
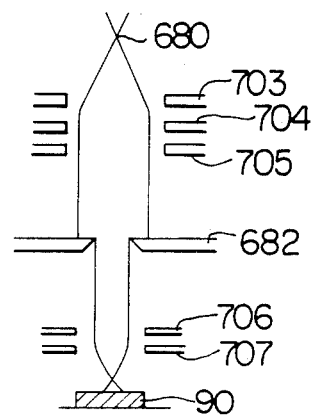

In the arrangement of FIG. 8B, a set of first-stage lenses 703, 704 and 705 and a pair of second-stage lenses 706 and 707 are disposed at a certain interval below the ion source 680, and an aperture 682 is interposed between the first-stage lenses 703, 704 and 705 and the second-stage lenses 706 and 707. The ion beam generated by the ion source 680 is transformed into a parallel beam by the first-stage lenses 703, 704 and 705, and the central portion of the parallel beam is extracted by the aperture 682, then the image of the aperture 682 is focused on the specimen 90 by the second-stage lenses 706 and 707. This arragement allows the use of much part of the ion beam for projecting the specimen as compared with the arrangement shown in FIG. 8A.

Figure 8C:
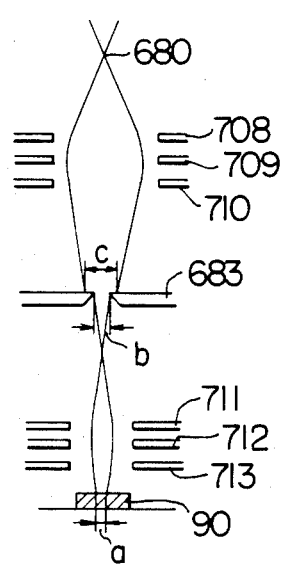
Figure 8D:
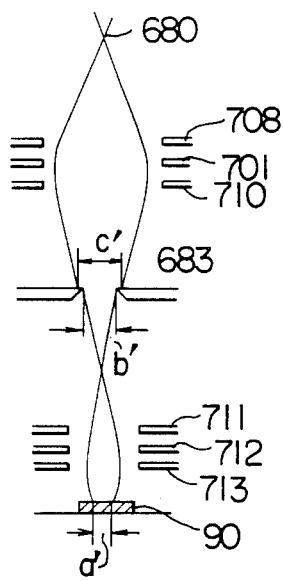

In the arrangement shown in FIGS. 8C and 8D, a set of first-stage lenses 708, 709 and 710 constituting a zoom lens set is disposed below the ion source 680, an aperture 683 with a variable opening area is disposed below the zoom lens set, and a set of second-stage lenses 711, 712 and 713 is disposed below the aperture 683. In FIG. 8C, the opening of the aperture 683 is adjusted to have a small dimension b and the ion beam is focused by the first-stage zoom lens set 708, 709 and 710 to a dimension of c which is slightly larger than the opening dimension b, and the image of the aperture 683 is projected in a dimension of a on the specimen 90 by the second-stage lens set 711, 712 and 713. In FIG. 8D, the opening of the aperture 683 is adjusted to have a dimension b' which is slightly larger than the dimension b in FIG. 8C, and the ion beam is focused by the first-stage lens set 708, 709 and 710 to a dimension of c' which is slightly larger than the dimension b', and the image of the aperture is projected in a dimension of a' on the specimen 90 by the second-stage lens set 711, 712 and 713. According to the arrangements shown in FIGS. 8C and 8D, further large part of the ion beam can be projected on the specimen 90. The opening of the aperture may be formed in arbitrary shape such as circle, polygon and the like, however, a square with variable dimensions allows the easiest use.

FIGS. 9A and 9B, FIGS. 10A through 10C, FIGS. 11A through 11C, and FIG. 12 show apertures with variable opening dimensions, the methods of using these apertures, and the device for positioning and scaling the opening of the aperture to a black spot defect.

Figure 9A:
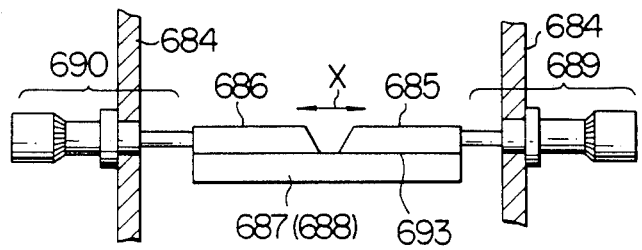
FIGS. 9A and 9B are enlarged longitudinal and side views of the aperture having variable opening dimensions.
Figure 9B:
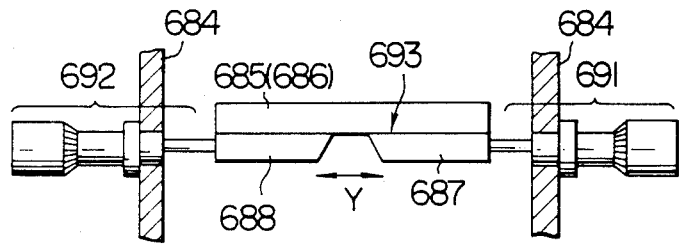

The aperture shown in FIGS. 9A and 9B includes the first and second slide plates 685 and 686 placed in series along the X-axis on the horizontal plane, the third and fourth slide plates 687 and 688 placed in series along the Y-axis, and the first, second, third and fourth fine manual feed means of the micrometer type 689, 690, 691 and 692 connected to the first, second, third and fourth slide plates, respectively, and mounted on the wall 684 of the vacuum container so that they can be operated outside the container. The confronting edges of the first and second slide plates 685 and 686 and the third and fourth slide plates 687 and 688 are shaped in knife-edge. The first and second slide plates 685 and 686 and the third and fourth slide plates 687 and 688 are assembled in a back-to-back relationship through sliding surfaces 693. In this aperture, the first and second slide plates 685 and 686 are moved in the X-direction by operating the first and second fine feed means 689 and 690 so that the dimension and position of the opening in the X-direction is adjusted, and the third and fourth slide plates 687 and 688 are moved in the Y-direction by operating the third and fourth fine feed means 691 and 692 so that the dimension and position of the opening in the Y-direction is adjusted.

Figure 10B:
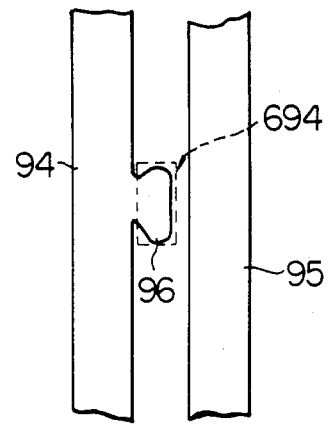
Figure 10C:
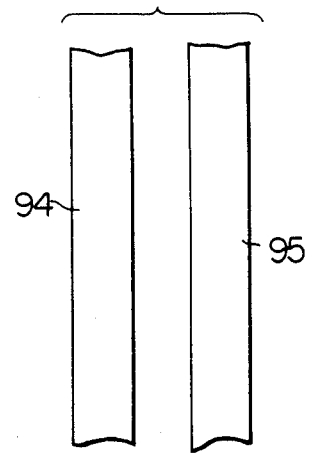
Figure 11A:
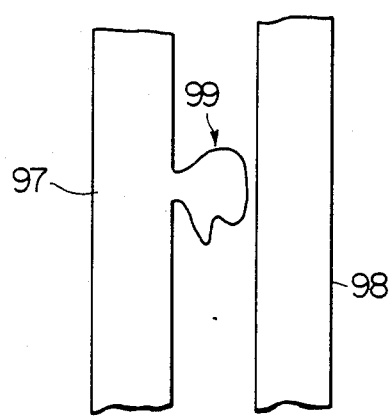
Figure 11B:
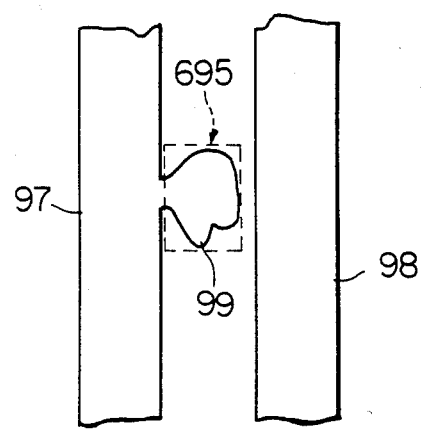
Figure 11C:
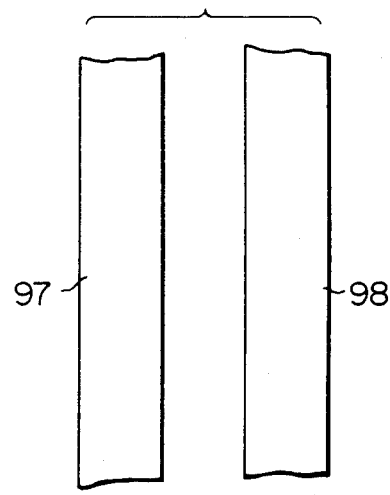

FIGS. 10A through 10C illustrate the application of the aperture shown in FIGS. 9A and 9B to the removal of a black spot defect which is deposited within a narrow gap between contiguous patterns. As shown in FIG. 10A, the first, second, third and fourth slide plates 685, 686, 687 and 688 of the aperture shown in FIGS. 9A and 9B are moved so as to adjust the position and dimensions of the aperture to those of the black spot defect 96 deposited on pattern 94, so that the black spot defect 96 is enclosed inside a rectangular frame 694, as shown in FIG. 10B, which defines the range of the projected ion beam. Then, the ion beam is projected inside the frame 694 so as to remove the black spot defect 96 and the pattern 94 is corrected as shown in FIG. 10C. In this case of processing, the deflection electrodes 75 and 76 are not activated.

FIGS. 10A through 11C illustrate the application of the aperture having variable opening dimensions shown in FIGS. 9A and 9B to the removal of a large black spot defect 99 deposited on pattern 97. The processing of this case is the same as that shown in FIGS. 10A through 10C, except that the rectangular frame 965 is formed to match the position and dimensions of the large black spot defect 99.

FIG. 12 shows the system using a TV monitor display 88 for setting the position and dimensions of the aperture with variable opening dimensions to those of a black spot defect on the pattern. The system includes an electronic line generator 696 and a TV monitor display 697 (88). In this system, potentiometers and the like are coupled to the first, second, third and fourth fine feed means 689, 690, 691 and 692 of the variable opening aperture shown in FIG. 9, and signals 698 from these potentiometers are supplied to the electronic line generator 696. The electronic line generator 696 provides for the TV monitor display 697 a signal 699 representing the positions of the first, second, third and fourth slide plates 685, 686, 687 and 688, so that the frame of the aperture is displayed on the TV monitor screen 697 by electronic lines $X_1$ and $X_2$ for the X-direction and $Y_1$ and $Y_2$ for the Y-direction. Using this system, the opening of the aperture can be adjusted accurately and easily so as to match the position and dimensions of the black spot defect.

The arrangement of the present invention may be modified to use voltage division resistors in place of the power supply 79 for the ion beam electrode and the power supplies 79 and 80 for the lenses.

FIG. 13, FIGS. 14A and 14B and FIG. 15 show other examples of a means for preventing the spot disturbance caused by charges of the ion beam, as against the arrangement shown in FIG. 5.

Figure 13:
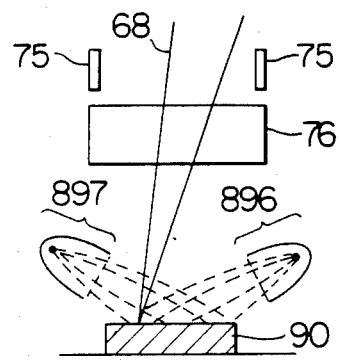
FIG. 13 is a cross-sectional view of a means for preventing the spot disturbance caused by charges of the ion beam, in contrast to that shown in FIG. 5.

The arrangement shown in FIG. 13 is the same as shown in FIG. 5 with the exception that the electron shower units 896 and 987 are directed to the surface of the specimen 90 so that electron streams 898 are projected to the surface of the specimen 90 thereby to prevent the specimen 90 from being charged by the ion beam.

Figure 14A:
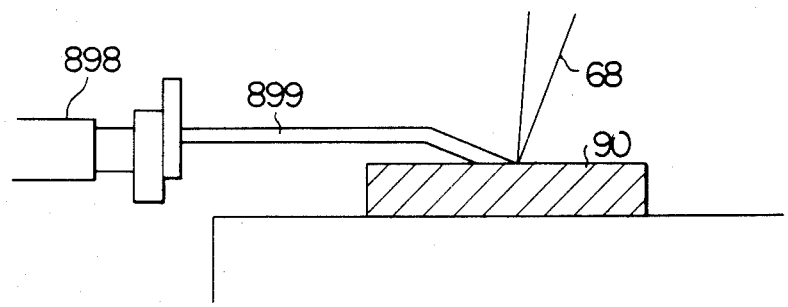
FIGS. 14A and 14B are front view and plan view showing still another example of the spot disturbance preventing means respectively.
Figure 14B:
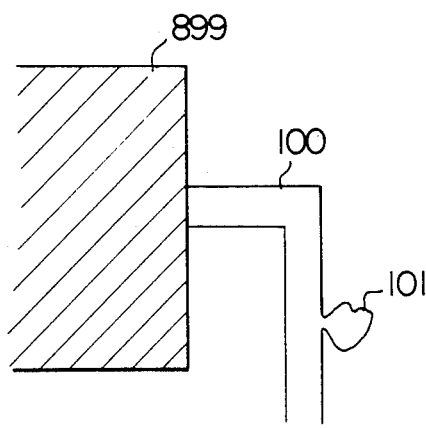

The arrangement shown in FIGS. 14A and 14B has an arm 898 which can be moved in the X-, Y- and Z-directions, with a prober 899 attached to the end of the grounded arm 898. In operation, the prober 899 comes in contact with a pattern 100 having a black spot defect 101, and when the ion beam 68 is projected to the specimen 90, charges on the pattern 100 are discharged through the prober 899 and arm 898 to the ground. In consequence, accumulation of charges on the specimen 90 can be prevented.

Figure 15:
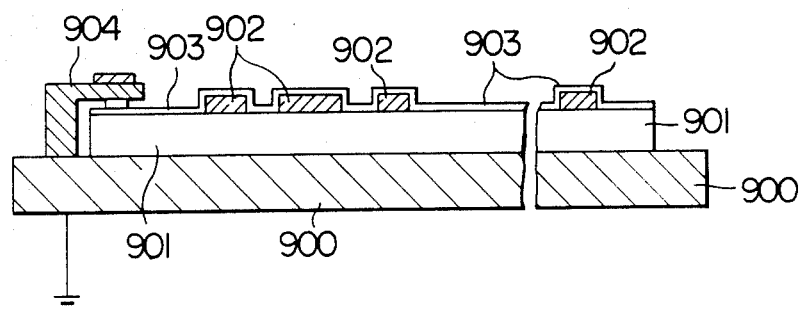
FIG. 15 is a longitudinal cross-sectional view of still another example of the spot disturbance preventing means.

In the arrangement shown in FIG. 15, a mask substrate 901 is placed on the specimen tray 60 and fixed with a clamper 904 made of conductive material. The entire surface of the mask substrate 901 is coated with a thin film 903 of metal or conductive compound such as $In_2O_3$ or $SnO_2$ by evaporation. In this arrangement, charges on the pattern 902 can be discharged through the clamper 904 and specimen tray 60 to the ground without changing the transmittivity of the specimen mask for the light, X-rays or ion beam, whereby accumulation of charges caused by the exposure to the ion beam can be prevented.

The present invention is summarized as follows.

According to the first aspect of the present invention, an ion beam is extracted from a high intensity ion source, which is focused to a fine spot by an optical system for charged-particles, and the spot is projected on a black spot defect of a specimen mask so as to remove the defect. The invention can effectively be applied with satisfactory productivity to the high accuracy correction of black spot defects which occur on a photomask, X-rays exposure mask and ion beam exposure mask used in fabricating IC patterns having a width of 1-1.5 $\mu$m or less than 1 $\mu$m.

According to the second aspect of the present invention, a black spot defect of the mask is exposed to the ion beam produced in the arrangement of the first aspect of invention while the beam spot is prevented from being disturbed by charges of the ion beam, whereby mask defects can be corrected more accurately.

According to the third aspect of the present invention, the arrangement comprises a specimen chamber within a vacuum container, a table for mounting a mask thereon within the specimen chamber, a high intensity ion source such as a liquid-metal ion source or an electric field ionizing ion source which operate in ultra-low temperature disposed within the vacuum container so that it confront the specimen chamber, a means for extracting an ion beam out of the ion source, a charged-particle optical system for focusing the extracted ion beam to a spot, and a means for controlling the energy, stability, spot diameter and projection direction of the ion beam and for projecting the beam spot to a black spot defect of the mask, whereby the invention as described as the first aspect can surely be practiced.

According to the fourth aspect of the present invention, a means for preventing spot disturbance caused by charges of the ion beam is added to the arrangement of the third aspect of the invention, whereby the invention as described in the second aspect can surely be practiced.

According to the method of the present invention, an ion beam derived from a high intensity ion source is focused to a fine area of 0.5 $\mu$m or less in diameter by an optical system for charged-particles, the beam spot is projected onto a mask which is used for manufacturing semiconductor integrated circuits and the like, the intensity of the resultant secondary charged-particles is measured, the measured value is compared with information of the original pattern so as to detect a mask defect, and when a defect has been detected, the ion beam is concentrated to scan or focus on the defective portion, and the ion beam is now provided with an micro ion beam current and an acceleration voltage suitable for the removal of defect by sputtering, whereby inspection and corrections of mask defects can be performed with a resolution and accuracy of 0.5 $\mu$m or less.

Moreover, according to the inventive apparatus comprising a vacuum container installed on a bed and having a pumping means, a table for a mask disposed on a bed within the vacuum container, a drive controller for the table, a high intensity ion source provided within the vacuum container, an ion beam extracting electrode, an ion beam control electrode, electrostatic lenses for focusing the ion beam, an ion beam aperture, a blanking electrode for deflecting the ion beam out of the aperture, deflection electrodes for causing the beam spot to scan the mask pattern, power supplies for the electrodes and electrostatic lenses, a secondary charged-particle detector which detects secondary charged-particles emitted on the mask as it is exposed to the ion beam and transduces the intensity of emission into an electrical signal, a comparison circuit which compares the output of the secondary charged-particle detector with information on the original pattern and determines the presence or absence of a defect, and a control system for switching the power supplies for observation and inspection of the mask and for correcting a defect on the mask, inspection and correction of a mask can be performed effectively by the single apparatus, whereby the work efficiency can be improved significantly and redundant facilities can be avoided.

We claim:

1. An ion beam processing apparatus provided within a vacuum container with a specimen chamber with a table for mounting a work piece or specimen provided therein comprising: a high density ion source confronting said specimen chamber, an extraction electrode for extracting an ion beam out of said ion source, a grid electrode for controlling energy and stability of the ion beam, a first aperture controlling the focused spot diameter and the spot current, at least a set of electrostatic lenses for focusing the ion beam which is outputted through said first aperture to form a spot, X-axis and Y-axis deflection electrodes which cause the beam spot to scan over the specimen, a secondary charged-particle detector which detects the intensity of secondary charged-particles emitted from the specimen as it is exposed to a low-power ion beam and transduces the intensity of emission into an electrical signal, a TV monitor which receives the output of said detector and deflection signals applied to said deflection electrodes and performs the scanning of a spot having an intensity in proportion to the output of said secondary charged-particle detector in synchronization with the ion beam which scans the specimen so as to allow the observation of the surface of the specimen, setting means for setting the range of processing to said TV monitor, a second aperture for interrupting a projection of the ion beam to the specimen and provided between at least a portion of said set of electrostatic lenses and said deflection electrodes, a beam blanking electrode disposed above said second aperture, said beam blanking electrode being operated by a signal produced by said setting means in correspondence to the deflection signal for deflecting the ion beam out of said second aperture, and switching means for switching the power supplies for detecting a deflect on the specimen by said detector and for processing said defect on said specimen by sputtering.

2. An ion beam processing apparatus according to claim 1, wherein said first aperture is an aperture of variable dimensions between said ion source and said lenses, said lenses focusing an image of said first aperture produced by the ion beam on the surface of the specimen.

3. An ion beam processing apparatus according to claim 1, further comprising electron shower means for electrically neutralizing the ion beam and provided between said deflection electrodes and the specimen.

4. An ion beam processing apparatus according to claim 1, comprising a conductive prober which comes into contact with a conductive pattern formed on the specimen so that charges generated during processing are removed by said prober.

5. An ion beam processing apparatus provided within a vacuum container with a specimen chamber with a table for mounting a work piece or specimen provided therein comprising: a high intensity ion source confronting said specimen chamber, an extraction electrode for extracting an ion beam out of said ion source, a grid electrode for controlling energy and stability of the ion beam, an aperture member with an aperture of variable dimensions for controlling the focused spot diameter and the spot current, at least a set of electrostatic lenses for focusing the ion beam which is outputted through said aperture to form a spot in the image of said aperture on the surface of the specimen, a beam blanking electrode, X-axis and Y-axis deflection electrodes which cause the beam spot to scan over the specimen, a secondary charged-particle detector which detects the intensity of secondary charged-particles emitted from the specimen as it is exposed to a low-power ion beam transduces the intensity of emission into an electrical signal, a TV monitor which receives the output of said detector and deflection signals applied to said deflection electrodes and performs the scanning of a spot having an intensity in proportion to the output of said secondary charged-particle detector in synchronization with the ion beam which scans the specimen so as to allow the observation of the surface of the specimen, a setting means for setting the range of processing to said TV monitor, and setting means producing signals for setting the dimensions and position of said aperture, and switching means for switching the power supplies for detecting a defect on the specimen by said detector and for processing said defect on the specimen by sputtering.

6. An ion beam processing apparatus comprising;
a vacuum container installed on a bed,
a table for mounting a specimen disposed on the bed within a specimen chamber of said vacuum container,
a drive controller means for controlling the movement of said table,
a high intensity ion source provided within said vacuum container,
an ion beam extraction electrode for extracting an ion beam out of said ion source,
a grid electrode for controlling energy and stability of the ion beam,
an aperture for controlling the focused spot diameter and the spot current,
electrostatic lenses for focusing the ion beam which is outputted through said aperture to form a spot,
a beam blanking electrode,
X-axis and Y-axis deflection electrodes which cause the beam spot to scan over the specimen,
a secondary charged-particle detector for detecting the intensity of secondary charged-particles emitted from the specimen as it is exposed to a low-power ion beam and transduces the intensity of emission into an electrical signal,
a defect detecting means for detecting a defect by comparing the output binary signal of said secondary charged-particle detector with binary signal information on the original pattern read out of a memory means, and
a switching means for switching the power supplies for detecting a defect on the specimen and for correcting said defect on the specimen by sputtering.

7. An ion beam processing apparatus according to claim 1, wherein said second aperture is rectangular.

8. An ion beam processing apparatus according to claim 1, further comprising electron shower means for electrically neutralizing the ion beam on the specimen.

9. An ion beam processing apparatus according to claim 5, wherein said aperture member with an aperture of variable dimensions for controlling the focus spot diameter and the spot current includes a first aperture, a second aperture being provided between at least a portion of said set of electrostatic lenses and said deflection electrodes for interrupting a projection of the ion beam to the specimen, said beam blanking electrode being located above said second aperture for deflecting the ion beam out of said second aperture.

10. An ion beam processing apparatus according to claim 9, wherein at least a portion of said electrostatic lenses are disposed between said second aperture and said ion source for transforming the ion beam from said ion source into a parallel beam or for focusing the ion beam to have a beam diameter on the plane of said second aperture slightly larger than the dimensions of said second aperture.

11. An ion beam processing apparatus according to claim 9, further comprising a conductive prober for contacting a conductive pattern formed on the specimen so that charges generated during the processing are removed by said prober.

12. A method of correcting defects on a mask comprising the steps of:

extracting an ion beam out of a high intensity ion source;

controlling energy and stability of the extracted ion beam by a grid electrode;

focusing the ion beam into a fine spot by an optical system for charged-particles;

detecting the intensity of secondary charge particles emitted from the mask as it is exposed to a low-power ion beam and transduced into an electrical signal by a secondary charged-particle detector;

detecting a defect on the mask by comparing the output binary signal of the secondary charged-particle detector with binary signal information on the original pattern read out of a memory means;

electrically neutralizing an electric charge charged on the mask by an electron shower;

switching the power supplies for detecting a defect on the mask and for removing the defect on the mask by sputtering; and removing an existing defect on the mask by projecting and sputtering the ion beam to the existing defect.

* * * * *